US012580597B2

(12) United States Patent
Kim et al.

(10) Patent No.: US 12,580,597 B2
(45) Date of Patent: Mar. 17, 2026

(54) CMOS CHIP AND ELECTRONIC DEVICE INCLUDING THE CMOS CHIP

(71) Applicant: Samsung Electronics Co., Ltd., Suwon-si (KR)

(72) Inventors: Youngmin Kim, Suwon-si (KR); Hongjong Park, Suwon-si (KR); Sangmin Yoo, Suwon-si (KR); Sangwook Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 643 days.

(21) Appl. No.: 18/063,301

(22) Filed: Dec. 8, 2022

(65) Prior Publication Data

US 2023/0308123 A1 Sep. 28, 2023

(30) Foreign Application Priority Data

Mar. 10, 2022 (KR) ........................ 10-2022-0029899
May 30, 2022 (KR) ........................ 10-2022-0066122

(51) Int. Cl.
| | |
|---|---|
| *H04B 1/04* | (2006.01) |
| *H03H 7/38* | (2006.01) |
| *H04B 1/18* | (2006.01) |

(52) U.S. Cl.
CPC ............. *H04B 1/0458* (2013.01); *H03H 7/38* (2013.01); *H04B 1/0483* (2013.01); *H04B 1/18* (2013.01)

(58) Field of Classification Search
CPC .......... H03F 1/56; H03H 7/38; H04B 1/0458; H04B 1/0483; H04B 1/18
See application file for complete search history.

(56) References Cited

U.S. PATENT DOCUMENTS

| | | | |
|---|---|---|---|
| 9,178,555 | B2 | 11/2015 | Ichitsubo et al. |
| 10,211,861 | B2 | 2/2019 | Vaillancourt et al. |
| 10,522,617 | B2 | 12/2019 | McPartlin et al. |
| 10,581,164 | B2 | 3/2020 | He et al. |
| 10,629,551 | B2 | 4/2020 | Dogiamis et al. |
| 10,931,033 | B2 | 2/2021 | Khlat |
| 11,050,454 | B2 | 6/2021 | Cetinoneri et al. |
| 11,095,318 | B2 | 8/2021 | Kim et al. |
| 2011/0234295 | A1* | 9/2011 | Uejima .................... H03H 7/38 |
| | | | 327/407 |
| 2020/0235716 | A1 | 7/2020 | Eid et al. |
| 2021/0250057 | A1 | 8/2021 | Choi et al. |
| 2021/0351810 | A1 | 11/2021 | Gorbachov |

FOREIGN PATENT DOCUMENTS

WO      WO-2017/009793 A1      1/2017

* cited by examiner

*Primary Examiner* — Nguyen T Vo
(74) *Attorney, Agent, or Firm* — Fish & Richardson P.C.

(57) ABSTRACT

A CMOS chip includes a signal converting circuit configured to convert a baseband signal and an RF signal, a plurality of ports through which the RF signal is transmitted or received, the plurality of ports being respectively included in a first transmission path, a second transmission path, and a reception path, and a plurality of matching networks connected to the signal converting circuit, the plurality of matching networks being respectively connected to the plurality of ports, a first matching network among the plurality of matching networks including an external matching network, and the external matching network being configured to perform an impedance matching of a compound semiconductor device.

20 Claims, 10 Drawing Sheets

CMOS CHIP AND ELECTRONIC DEVICE INCLUDING THE CMOS CHIP

CROSS-REFERENCE TO RELATED APPLICATIONS

This application claims priority under 35 U.S.C. § 119 to Korean Patent Application No. 10-2022-0029899 filed on Mar. 10, 2022, and Korean Patent Application No. 10-2022-0066122 filed on May 30, 2022, in the Korean Intellectual Property Office, the disclosures of which are hereby incorporated by reference herein in their entireties.

BACKGROUND

Embodiments of the present disclosure relate to a complementary metal-oxide-semiconductor (CMOS) chip and an electronic device including the CMOS chip, and more particularly, relate to a CMOS chip capable of simultaneously or contemporaneously supporting different types of terminals, and an electronic device including the CMOS chip.

Wi-Fi terminals may be classified into a flagship terminal demanding higher performance and a volume terminal (e.g., that does not demand higher performance). The flagship terminal implements a front-end solution focusing on higher performance by using a compound (e.g., GaAs, SiGe, etc.)-based higher-cost front-end module (FEM). In contrast, the volume terminal does not use a higher-cost FEM for higher performance.

However, the demand for Wi-Fi transmission (TX) performance/efficiency improvement in the volume terminal continues, and additionally, frequency extension to the Wi-Fi 6E specification (~7.2 GHz) in addition to the existing band (<5.9 GHZ) is also demanded. In addition, even though the flagship terminal suffers a certain degree of deterioration in Wi-Fi performance, an alternative solution to the use of the higher-cost FEM is continuously being reviewed.

SUMMARY

Embodiments of the present disclosure provide a CMOS chip capable of supporting a hybrid type transceiver in which a compound device-based power cell (PC) and a complementary metal-oxide-semiconductor (CMOS) process-based passive design are combined, and an electronic device including the CMOS chip.

According to embodiments of the present disclosure, a CMOS chip includes a signal converting circuit configured to convert a baseband signal and an RF signal, a plurality of ports through which the RF signal is transmitted or received, the plurality of ports being respectively included in a first transmission path, a second transmission path, and a reception path, and a plurality of matching networks connected to the signal converting circuit, the plurality of matching networks being respectively connected to the plurality of ports, a first matching network among the plurality of matching networks including an external matching network, and the external matching network being configured to perform an impedance matching of a compound semiconductor device.

According to embodiments of the present disclosure, an electronic device includes processing circuitry configured to generate a first baseband signal, an RF chip configured to generate a transmission RF signal based on the first baseband signal, or to process a reception RF signal to obtain a second baseband signal, a FEM configured to guide the transmission RF signal to one of a first transmission path or a second transmission path, and guide the reception RF signal to a reception path, and an antenna configured to transmit the transmission RF signal or to receive the reception RF signal, wherein the RF chip includes a CMOS chip including a signal converting circuit configured to generate the transmission RF signal or process the reception RF signal, a first plurality of ports respectively included in the first transmission path, the second transmission path, and the reception path, and a plurality of matching networks connected to the signal converting circuit, the plurality of matching networks being respectively connected to the first plurality of ports, a second plurality of ports connected to the FEM, the second plurality of ports being respectively included in the first transmission path, the second transmission path, and the reception path, and a power cell between a first port and a second port, the first plurality of ports including the first port, the second plurality of ports including the second port, and the power cell including a compound semiconductor device, and a first matching network among the plurality of matching networks includes an external matching network, the external matching network being configured to perform an impedance matching of the compound semiconductor device.

According to embodiments of the present disclosure, an electronic device includes processing circuitry configured to generate a first baseband signal, an RF chip configured to generate a transmission RF signal based on the first baseband signal, or to process a reception RF signal to obtain a second baseband signal, a FEM configured to amplify the transmission RF signal to obtain an amplified transmission RF signal, and guide the amplified transmission RF signal to a first transmission path, and amplify the reception RF signal to obtain an amplified reception RF signal, and guide the amplified transmission RF signal to a reception path, and an antenna configured to transmit the transmission RF signal or to receive the reception RF signal, wherein the RF chip includes a CMOS chip including a signal converting circuit configured to generate the transmission RF signal or process the reception RF signal, a first plurality of ports respectively included in the first transmission path, a second transmission path, and the reception path, and a plurality of matching networks connected to the signal converting circuit, the plurality of matching networks being respectively connected to the first plurality of ports, and a second plurality of ports respectively included in the first transmission path, the second transmission path, and the reception path, and a first matching network among the plurality of matching networks includes an external matching network, the external matching network being configured to perform an impedance matching of a compound semiconductor device, and the second transmission path is deactivated.

BRIEF DESCRIPTION OF THE FIGURES

A detailed description of each drawing is provided to facilitate a more thorough understanding of the drawings referenced in the detailed description of the present disclosure.

DETAILED DESCRIPTION

Hereinafter, embodiments of the present disclosure may be described in detail and clearly to such an extent that one of ordinary skill in the art may easily implement the same.

Figure 1:
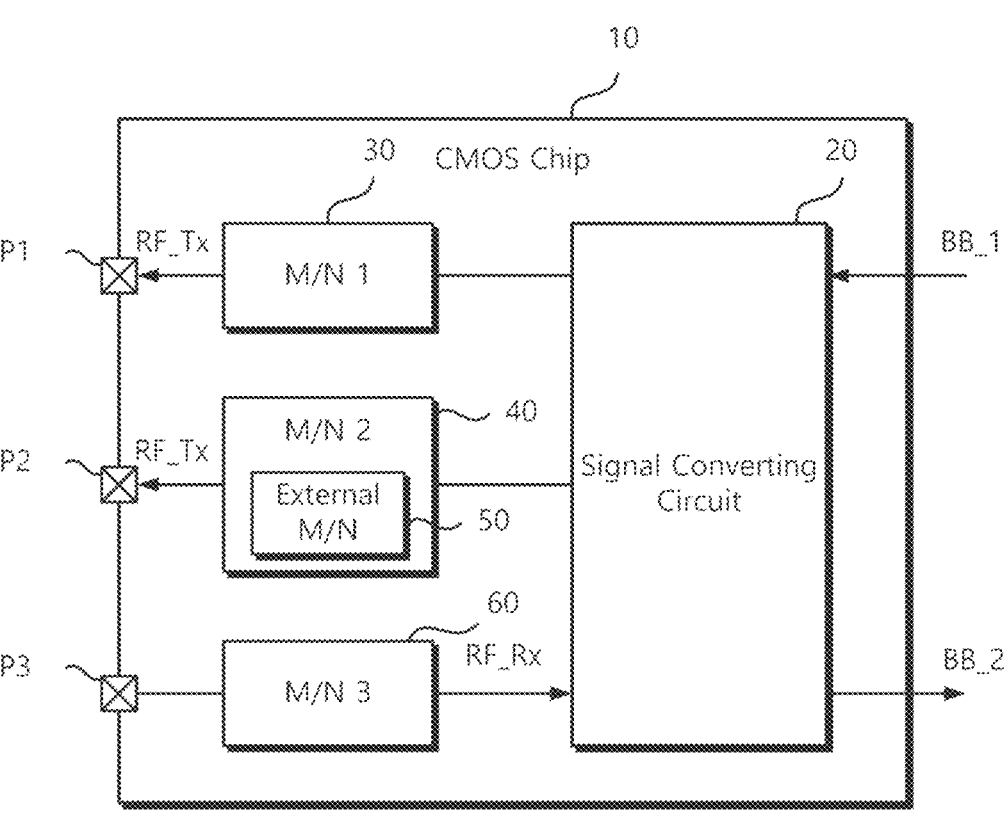
FIG. 1 is a diagram illustrating a CMOS chip, according to embodiments of the present disclosure.

FIG. 1 is a diagram illustrating a CMOS chip, according to embodiments of the present disclosure.

Referring to FIG. 1, a CMOS chip 10 according to embodiments of the present disclosure includes a signal converting circuit 20, first to third ports P1, P2, and P3 (e.g., a first port P1, a second port P2 and a third port P3), and/or a first matching network to a third matching network 30, 40, and 60 (e.g., a first matching network 30, a second matching network 40 and a third matching network 60), which are a plurality of matching networks.

The signal converting circuit 20 is configured to convert a baseband signal and an RF signal. The signal converting circuit 20 may be implemented based on (e.g., fabricated according to) a CMOS process. In the present disclosure, the baseband signal may be used to collectively refer to a first baseband signal BB_1, provided for conversion to an RF signal (hereinafter referred to as a transmission RF signal RF_Tx) transmitted through a transmission path, and a second baseband signal BB_2 provided for conversion (e.g., resulting from conversion) of an RF signal (hereinafter, referred to as a reception RF signal RF_Rx) received through a reception path, to a processor. In FIG. 1, a first transmission path may include the first matching network 30 and the first port P1, and a second transmission path may include the second matching network 40 and the second port P2, and the reception path may include the third matching network 60 and the third port P3. In addition, the RF signal may be used to collectively refer to the above-described transmission RF signal RF_Tx and reception RF signal RF_Rx. For example, the signal converting circuit 20 may receive the first baseband signal BB_1 to convert it into the transmission RF signal RF_Tx through an up-conversion operation, and may provide the transmission RF signal RF_Tx to the first matching network 30 or the second matching network 40. For example, the signal converting circuit 20 may convert the reception RF signal RF_Rx into the second baseband signal BB_2 through a down-conversion operation.

The signal converting circuit 20 may guide the transmission RF signal RF_Tx to one of the first transmission path and/or the second transmission path.

According to embodiments, the signal converting circuit 20 may switch the first transmission path and the second transmission path according to a first mode and a second mode. In detail, depending on the switching, the first transmission path is activated in the first mode to guide the transmission RF signal RF_Tx through the first matching network 30 and the first port P1, and the second transmission path is activated in the second mode to guide the transmission RF signal RF_Tx through the second matching network 40 and the second port P2. In this case, the first transmission path may be configured to transmit the transmission RF signal RF_Tx with a lower power than the second transmission path, and the second transmission path may be configured to transmit the transmission RF signal RF_Tx with a higher power than the first transmission path. Accordingly, in terms of output, the first mode may be referred to as a low performance mode, and the second mode may be referred to as a high performance mode.

According to embodiments, the signal converting circuit 20 may activate or deactivate (e.g., select or deselect) the second matching network 40 according to whether the compound semiconductor device is included in the second transmission path. In the present disclosure, the compound semiconductor device may be a group III-V compound semiconductor device, for example, a high-electron-mobility transistor (pHEMT) or a heterojunction bipolar transistor (HBT). It may be understood that when the second matching network 40 is deactivated according to the signal converting circuit 20, the second transmission path is also deactivated. When the second transmission path is deactivated, only the first transmission path is used for transmitting the transmission RF signal RF_Tx.

The first to third ports P1, P2, and P3 are provided to transmit the transmission RF signal RF_Tx or to receive the reception RF signal RF_Rx, respectively, and are connected to the first to third matching networks 30, 40, and 60, respectively. The first port P1 and the second port P2 are provided to transmit the transmission RF signal RF_Tx, and are included in the first transmission path and the second transmission path, respectively. The third port P3 is provided to receive the reception RF signal RF_Rx and is included in the reception path.

The first to third matching networks 30, 40, and 60 are provided between the first to third ports P1, P2, and P3 and the signal converting circuit 20. The first to third matching networks 30, 40, and 60 may be implemented based on (e.g., fabricated according to) a CMOS process. The first to third matching networks 30, 40, and 60 are respectively connected to the signal converting circuit 20 and the first to third ports P1, P2, and P3 for impedance matching. According to embodiments, the first matching network 30 is configured to perform impedance matching for supporting the first transmission path, and the third matching network 60 is configured to perform impedance matching for supporting the reception path.

Unlike the first matching network 30 and the third matching network 60, the second matching network 40 includes an external matching network 50 for impedance matching of the compound semiconductor device. The compound semiconductor device is an external device from a viewpoint of the CMOS chip 10, and the external matching network 50 is additionally provided in the second matching network 40 specifically for impedance matching with the compound semiconductor device, which is the external device. However, the second matching network 40 may be deactivated as described above, and in this case, the external matching network 50 may also be deactivated.

According to the above-described CMOS chip 10, among a plurality of matching networks provided for impedance matching, in particular, as the second matching network 40 corresponding to the second transmission path includes an additional external matching network 50 for impedance matching with the compound semiconductor device which is an external device, it is possible to support both volume terminals with improved performance compared to conventional volume terminals, and flagship terminals that operate with higher performance.

In addition, since the signal converting circuit 20 and the first to third matching networks 30, 40, and 60 of the CMOS chip 10 of the present disclosure may be implemented by (e.g., fabricated according to) a CMOS process that may be implemented at a lower cost, the CMOS chip 10 of the present disclosure may support both volume terminals and flagship terminals while being implemented with a lower-cost CMOS process.

Figure 2:
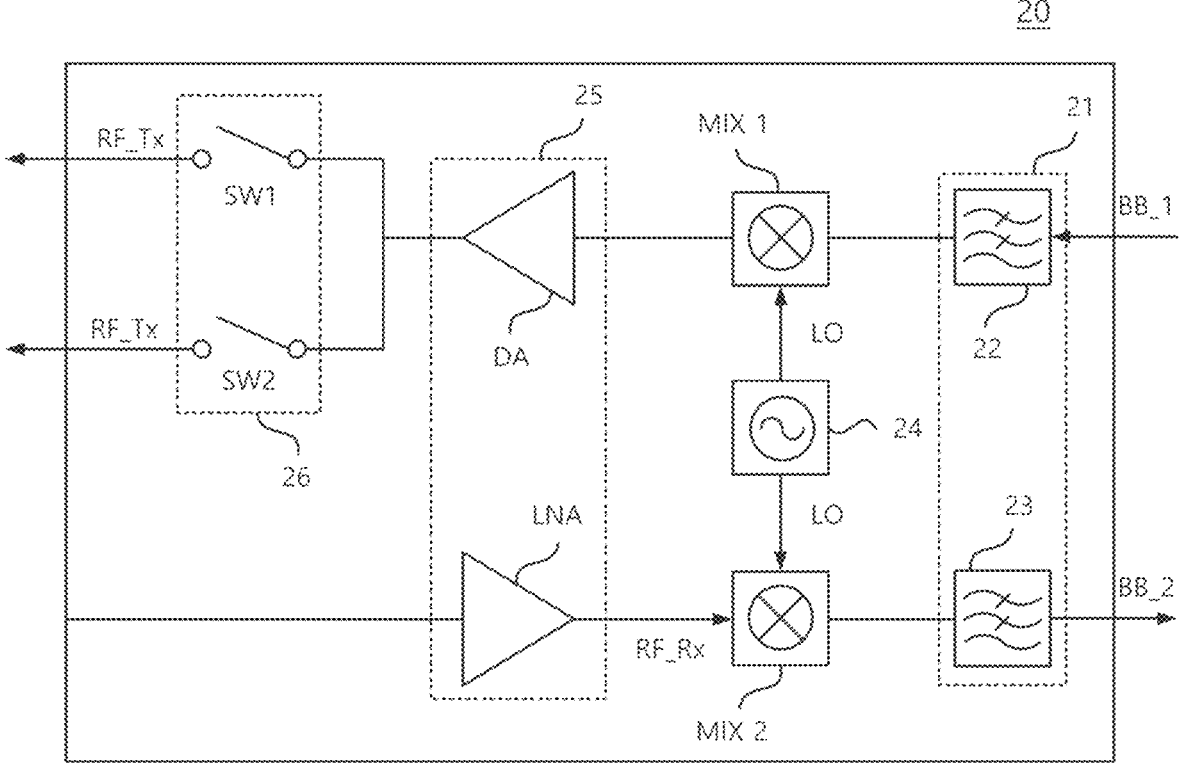
FIG. 2 is a diagram illustrating a signal converting circuit included in a CMOS chip.

FIG. 2 is a diagram illustrating a signal converting circuit included in a CMOS chip.

Referring to FIG. 2, the signal converting circuit 20 includes a filter unit 21, a PLL 24, mixer units MIX1 and MIX2 (e.g., a first mixer unit MIX1 and a second mixer unit MIX2), an amplifying unit 25, and/or a switching unit 26.

The filter unit 21 is provided to filter the baseband signal, and may include a first filter 22 for filtering the first baseband signal BB_1 and a second filter 23 for filtering the second baseband signal BB_2. For example, the filter unit 21 may be implemented as a low pass filter (LPF), and a cut-off frequency of the filter may be appropriately designed to filter the baseband signal.

The PLL (phased-lock loop) 24 generates a local oscillator (LO) signal used for up-conversion and/or down-conversion, and transfers the generated LO signal 'LO' to the mixer units MIX1 and MIX2.

The mixer units MIX1 and MIX2 perform a mixing operation based on the received LO signal LO. The mixer units MIX1 and MIX2 include a first mixer MIX 1 that up-converts the first baseband signal BB_1 to generate the transmission RF signal RF_Tx, and a second mixer MIX 2 that down-converts the reception RF signal RF_Rx to generate the second baseband signal BB_2.

The amplifying unit 25 is provided between the mixer units MIX1 and MIX2 and the switching unit 26 to amplify the transmission RF signal RF_Tx or the reception RF signal RF_Rx. The amplifying unit 25 includes a driver amplifier (DA) for amplifying the generated transmission RF signal RF_Tx converted from the mixer units MIX1 and MIX2 and a low noise amplifier (LNA) for low-noise amplification of the reception RF signal RF_Rx. In this case, the DA may be implemented to improve back-off efficiency at the maximum (or highest) output power.

The switching unit 26 is connected to the amplifying unit 25 (in detail, the DA included in the amplifying unit 25), the first matching network 30, and the second matching network 40, and guides the transmission RF signal RF_Tx to one of the first transmission path including the first matching network 30 and the second transmission path including the second matching network 40, based on the switching operation. The switching unit 26 includes a first switch SW1 included in the first transmission path to guide the transmission RF signal RF_Tx according to switching, and a second switch SW2 included in the second transmission path to guide the transmission RF signal RF_Tx according to the switching.

According to embodiments, when the compound semiconductor device is included in the second transmission path, the first switch SW1 may be turned on in the first mode to guide the transmission RF signal RF_Tx, and the second switch SW2 may be turned on in the second mode to guide the transmission RF signal RF_Tx. Accordingly, when the second switch SW2 operates in the second mode, the second switch SW2 may activate the second matching network 40 connected to the switching unit 26.

According to embodiments, when the compound semiconductor device is not included in the second transmission path, the second switch SW2 may be always turned off (e.g., may not be selectable). Accordingly, the second matching network 40 connected to the second switch SW2 may be deactivated. When the second matching network 40 is deactivated, the transmission RF signal RF_Tx is guided through the first switch SW1 when the first switch SW1 is turned on.

Figure 3:
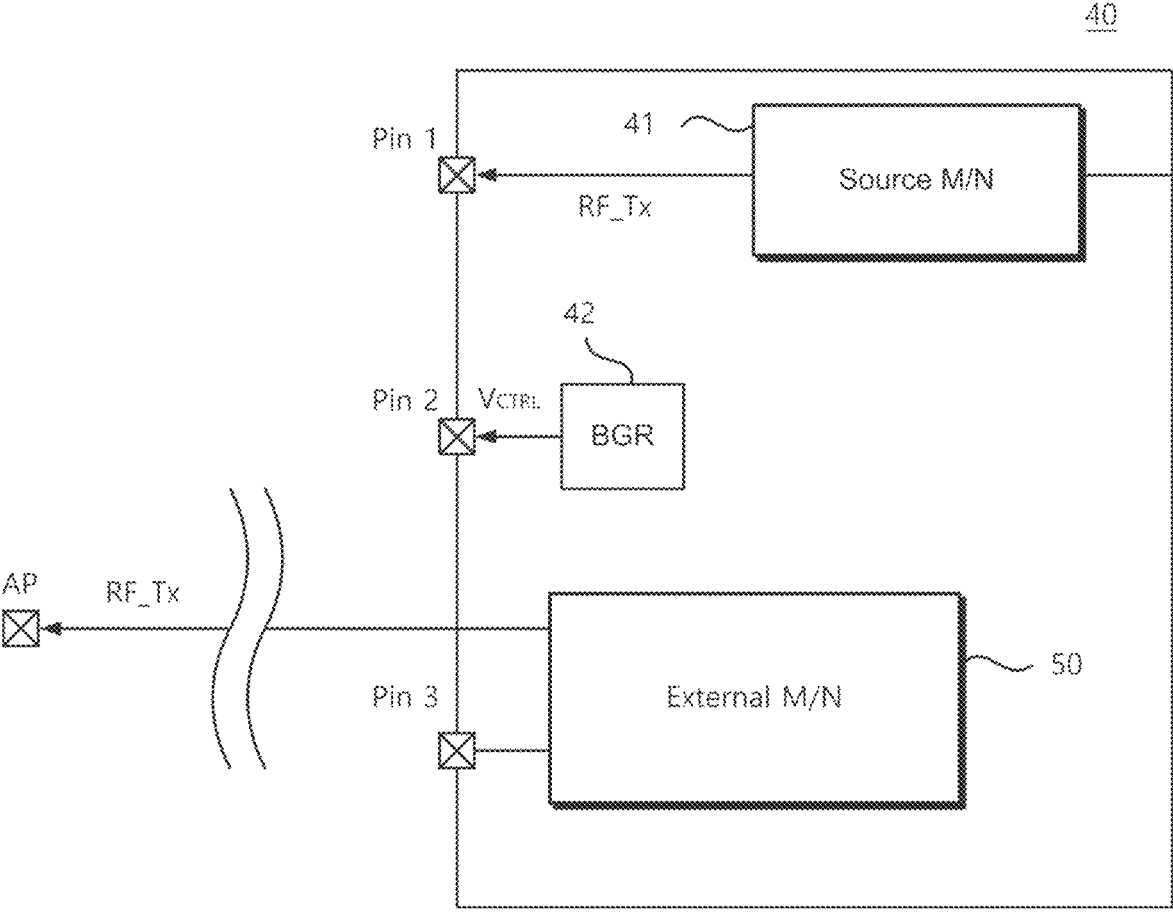
FIG. 3 is a diagram illustrating a second matching network included in a CMOS chip.

FIG. 3 is a diagram illustrating a second matching network included in a CMOS chip.

Referring to FIG. 3, the second matching network 40 includes first to third pins Pin 1, Pin 2, and Pin 3, a source matching network 41, a band gap reference (BGR) circuit 42, and/or the external matching network 50.

The first to third pins Pin 1, Pin 2, and Pin 3 are pins included in the second port P2, and are connected to the source matching network 41, the BGR circuit 42, and/or external matching network 50, respectively. Accordingly, it may be understood that the source matching network 41, the BGR circuit 42, and/or the external matching network 50 are connected to the second port P2.

The source matching network 41 is connected to the first pin Pin 1 and is provided for impedance matching between the above-described DA and the compound semiconductor device. The source matching network 41 may be implemented based on (e.g., fabricated according to) a CMOS process.

The BGR circuit 42 provides a reference signal $V_{CTRL}$ through the second pin Pin 2. The reference signal $V_{CTRL}$ may be, for example, a reference voltage or a reference current, and may be used to provide a uniform bias.

The external matching network 50 is connected to the third pin Pin 3 and an antenna port AP to provide impedance matching of the compound semiconductor device, which is an external device. In this case, the antenna port AP may correspond to a fifth port P5 to be described later. The external matching network 50 may be implemented based on (e.g., fabricated according to) a CMOS process.

Figure 4:
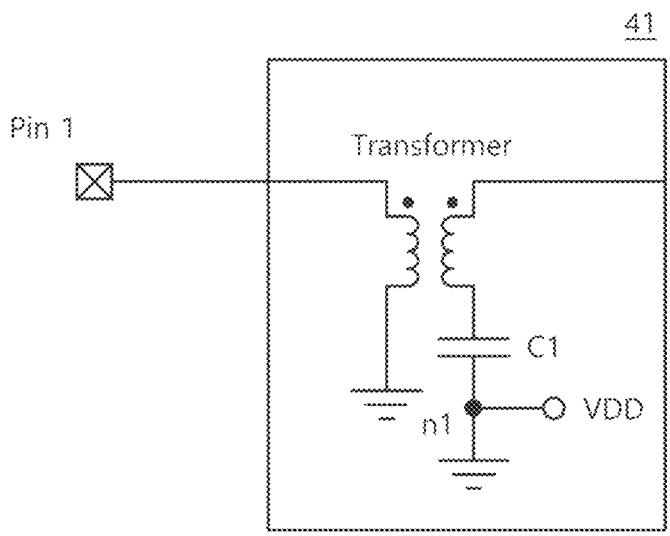
FIG. 4 is a diagram illustrating a source matching network of FIG. 3.

FIG. 4 is a diagram illustrating a source matching network of FIG. 3.

Referring to FIG. 4, the source matching network 41 according to embodiments may include a transformer having a primary side connected to the DA and a secondary side connected to the first pin Pin 1 to provide impedance matching, a capacitor C1 connected to the primary side of the transformer and a first node n1, and a VDD port VDD connected to the first node n1. The VDD port VDD may provide a VDD voltage through the first pin Pin 1. Noise is removed from the VDD voltage through the capacitor C1.

Figure 5:
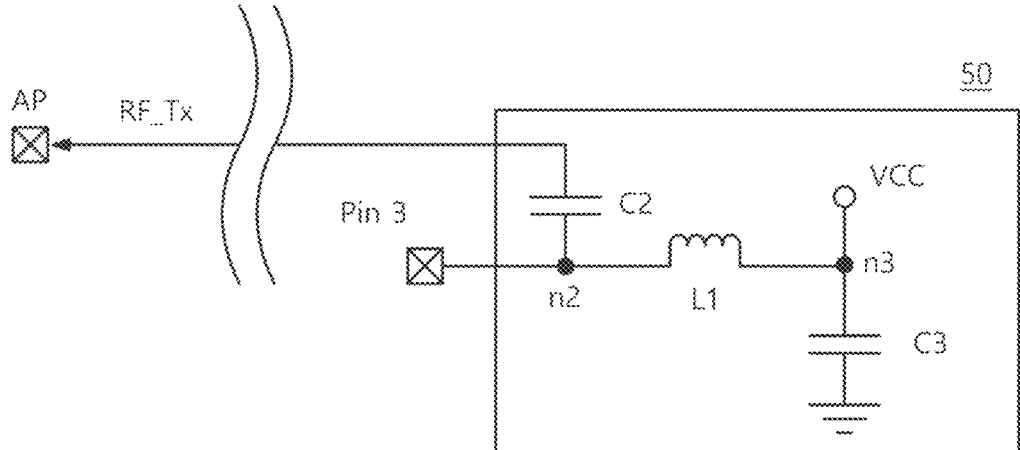
FIG. 5 is a diagram illustrating an external matching network of FIG. 3.

FIG. 5 is a diagram illustrating an external matching network of FIG. 3.

Referring to FIG. 5, the external matching network 50 according to embodiments may include a capacitor C2 having one end connected to a second node n2 connected to the third pin Pin 3 and the other end connected to the antenna port AP, an inductor L1 provided between the second node n2 and a third node n3, a capacitor C3 connected to the third node n3, and a VCC port VCC connected to the third node n3. The capacitor C2 and the inductor L1 provide impedance matching to the compound semiconductor device, and may be a load matching network from the viewpoint of the compound semiconductor device. The VCC port VCC may provide a VCC voltage to the compound semiconductor device through the third pin Pin 3. Noise is removed from the VCC voltage through the capacitor C3.

Since the above description related to the source matching network 41 and the external matching network 50 are merely examples, embodiments are not limited thereto and may include various matching networks capable of providing impedance matching to an external device.

According to the second matching network 40 of the present disclosure described above, unlike the first matching network 30 and the third matching network 60, as the external matching network 50 for impedance matching of the compound semiconductor device, which is an external device, is additionally included in the second matching network 40, it is possible to support both the volume terminals with improved performance compared to conventional volume terminals, and flagship terminals that operate with higher performance. Therefore, unlike with conventional terminals, the CMOS chip 10 for the flagship terminal and the volume terminal are not developed separately (or differently) according to embodiments. The second matching network 40 may provide impedance matching of an external device through the source matching network 41 and the external matching network 50, which is a load matching network from the viewpoint of the external device. In particular, since the load matching network is included in the second matching network 40 implemented through (e.g., fabricated according to) the CMOS process instead of being included in an external device stage, it is possible to reduce a cost while minimizing (or reducing) an area occupied by the compound semiconductor device.

As described above, embodiments related to the CMOS chip 10 have been described. Hereinafter, embodiments related to an electronic device including the CMOS chip 10 will be described. The electronic device may be referred to as a transceiver or a terminal. Hereinafter, the detailed description related to the CMOS chip 10 may be replaced with the description as described above to avoid redundancy.

Figure 6:
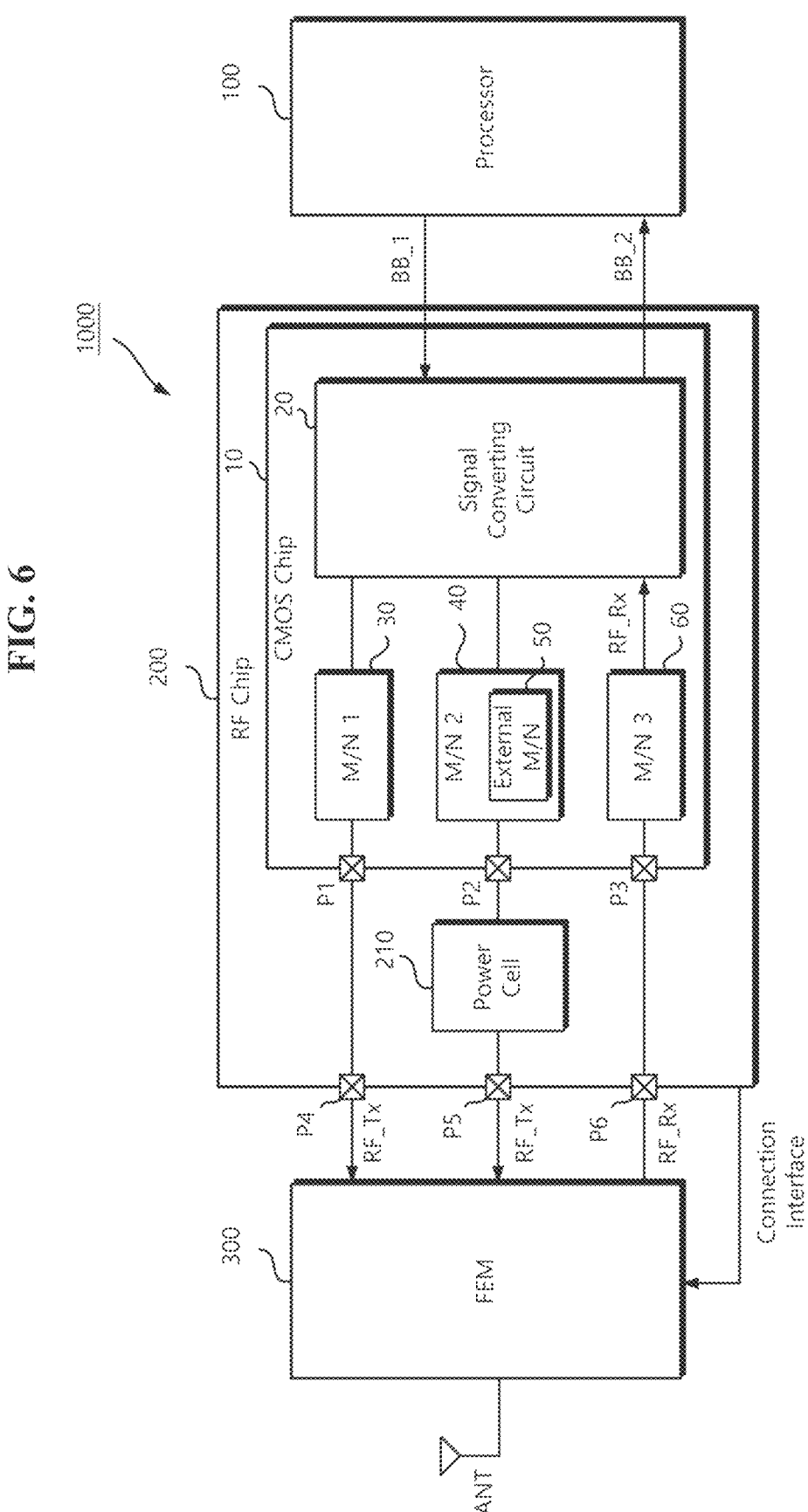
FIG. 6 is a diagram illustrating an electronic device, according to embodiments of the present disclosure.

FIG. 6 is a diagram illustrating an electronic device, according to embodiments of the present disclosure.

Referring to FIG. 6, an electronic device 1000 includes a processor 100, a radio frequency (RF) chip 200, an FEM 300, and/or an antenna ANT. The electronic device 1000 of FIG. 6 may correspond to the above-described volume terminal.

The processor 100 may generate the baseband signal based on data to be transmitted to another electronic device (e.g., another electronic device 1000, another user equipment and/or a base station) connected with the electronic device 1000 through a network to provide the baseband signal to the RF chip 200. Alternatively, the processor 100 may extract data transmitted by the other electronic device from the baseband signal received through the RF chip 200. For example, the processor 100 may modulate data to be transmitted to the other electronic device, and may output the baseband signal by converting the modulated digital data. For example, the processor 100 may obtain digital data by converting the baseband signal received from the other electronic device. The processor 100 may also be referred to as a modem.

According to embodiments, the electronic device 1000 may be fixed or mobile and may refer to any device that may communicate with the other electronic device (e.g., the base station) to transmit and receive data and/or control information. For example, electronic device 1000 may be referred to as a user equipment (UE), a terminal, a terminal equipment, a mobile station (MS), a mobile terminal (MT), a user terminal (UT), a subscriber station (SS), a wireless device, a handheld device, or the like.

The network between the electronic device 1000 and the other electronic device may be a wireless communication network supporting communication between multiple users by sharing available network resources. For example, in the wireless communication network, information may be transmitted in various multiple access schemes, such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), OFDM-FDMA, OFDM-TDMA, and OFDM-CDMA. The electronic device 1000 may communicate with the other electronic device through an uplink UL and a downlink DL, or through a sidelink such as device-to-device (D2D) connection.

The RF chip 200 is connected to the processor 100, and generates the transmission RF signal RF_Tx based on the first baseband signal BB_1 generated by the processor 100 or processes the reception RF signal RF_Rx to obtain the second baseband signal BB_2.

The RF chip 200, according to embodiments, includes the CMOS chip 10, fourth to sixth ports P4, P5, and P6 (e.g., a fourth port P4, a fifth port P5 and a sixth port P6), and/or a power cell 210 as illustrated in FIG. 6. The CMOS chip 10 is the same as (or similar to) that illustrated in FIGS. 1 to 3.

The fourth to sixth ports P4, P5, and P6 are connected to the first to third ports P1, P2, and P3 included in the CMOS chip 10, respectively. The fourth to sixth ports P4, P5, and P6 are included in the first transmission path, the second transmission path, and the reception path, respectively. Accordingly, the first transmission path is defined as a path including the first matching network 30, the first port P1 and the fourth port P4, the second transmission path is defined as a path including the second matching network 40, the second port P2, and the fifth port P5, and the reception path is defined as a path including the third matching network 60, the third port P3, and the sixth port P6. Since the fourth to sixth ports P4, P5, and P6 are connected to the FEM 300, they may also be referred to as the antenna port AP.

According to embodiments, the RF chip 200 may be implemented as a flip-chip ball grid array (FC-BGA), and the fourth to sixth ports P4, P5, and P6 may be connected to the CMOS chip 10 through a re-distribution layer (RDL).

The power cell 210 is provided between the second port P2 and the fifth port P5. Accordingly, it may be understood that the power cell 210 is included in the second transmission path. The power cell 210 may include a compound semiconductor device and may be configured to further amplify the power of the transmission RF signal RF_Tx. The compound semiconductor device included in the power cell 210 may be subjected to impedance matching based on the second matching network 40. Since the power cell 210 includes the compound semiconductor device unlike the CMOS chip 10, it may be implemented through (e.g., fabricated according to) an IC design technology rather than a CMOS process. Therefore, the RF chip 200 may be implemented as a hybrid form through a CMOS process and a compound semiconductor device-based IC design technology.

The RF chip 200 guides the transmission RF signal RF_Tx to one of the first transmission path and/or the second transmission path, according to the first mode and/or the second mode based on the CMOS chip 10. For example, the RF chip 200 may guide the transmission RF signal RF_Tx to the first transmission path in the case of the first mode in which transmission with lower power is selected, and the RF chip 200 may guide the transmission RF signal RF_Tx to the second transmission path including the power cell 210 in the case of the second mode in which transmission with higher power is selected. The RF chip 200 switches the first transmission path and the second transmission path according to the first mode and the second mode through the signal converting circuit 20. In the case of the first transmission path, the transmission RF signal RF_Tx is transmitted through the signal converting circuit 20, but in the case of the second transmission path, the transmission RF signal RF_Tx is transmitted through the power cell 210 as well as the signal converting circuit 20. Accordingly, the transmission RF signal RF_Tx may be amplified with a higher output through the DA included in the signal converting circuit 20 and the power cell 210.

The RF chip 200 may be connected to the FEM 300 through a connection interface such as, for example, a mobile industry processor interface (MIPI) to control the FEM 300. In the first mode, the RF chip 200 may allow the FEM 300 to guide the transmission RF signal RF_Tx to the first transmission path, and in the second mode, the RF chip 200 may allow the FEM 300 to guide the transmission RF signal RF_Tx to the second transmission path.

The RF chip 200 provides impedance matching through the first to third matching networks 30, 40, and 60 included in the CMOS chip 10. In particular, since the second matching network 40 includes the external matching network 50 for impedance matching of the compound semiconductor device included in the power cell 210, linearity of the compound semiconductor device may be ensured (or improved).

The FEM 300 is connected to the RF chip 200 and guides the transmission RF signal RF_Tx and the reception RF signal RF_Rx to one of the first transmission path, the second transmission path, and/or the reception path. For example, the FEM 300 provides the transmission RF signal RF_Tx to the antenna ANT and/or provides the reception RF signal RF_Rx to the RF chip 200.

According to embodiments, the FEM 300 may be connected to the fourth to sixth ports P4, P5, and P6 through a printed circuit board (PCB) or a flexible PCB (FPCB). In addition, according to embodiments, the FEM 300 may be connected to the RF chip 200 through a connection interface such as the MIPI and may operate under a control of the RF chip 200.

The antenna ANT may be implemented as one or more antennas, and is configured to transmit the transmission RF signal RF_Tx and/or to receive the reception RF signal RF_Rx. According to embodiments, the electronic device 1000 may transmit the transmission signal RF_TX via the antenna ANT through the second transmission path (e.g., by amplifying the transmission signal RF_TX through the power cell 210).

According to the above-described electronic device 1000, it is possible to have higher power and higher efficiency transmission/reception characteristics even in a volume terminal that does not use the higher cost FEM 300 by providing the power cell 210 including the compound semiconductor device. Conventional volume terminals are implemented with a CMOS process that may be implemented at a lower cost, but the IC (integrated circuit) design technology based on the CMOS process is limited in obtaining higher power and higher efficiency transmitter characteristics due to its high knee voltage ($V_{knee}$) and low breakdown voltage. In contrast, since embodiments of the present disclosure may be implemented in a hybrid form using a compound semiconductor device and a CMOS process, the present disclosure may have advantages in terms of unit cost and performance. In addition, since impedance matching of the compound semiconductor device is provided through the external matching network 50 implemented in the CMOS process, linearity may be ensured (or improved) and unit cost may be reduced.

Figure 7:
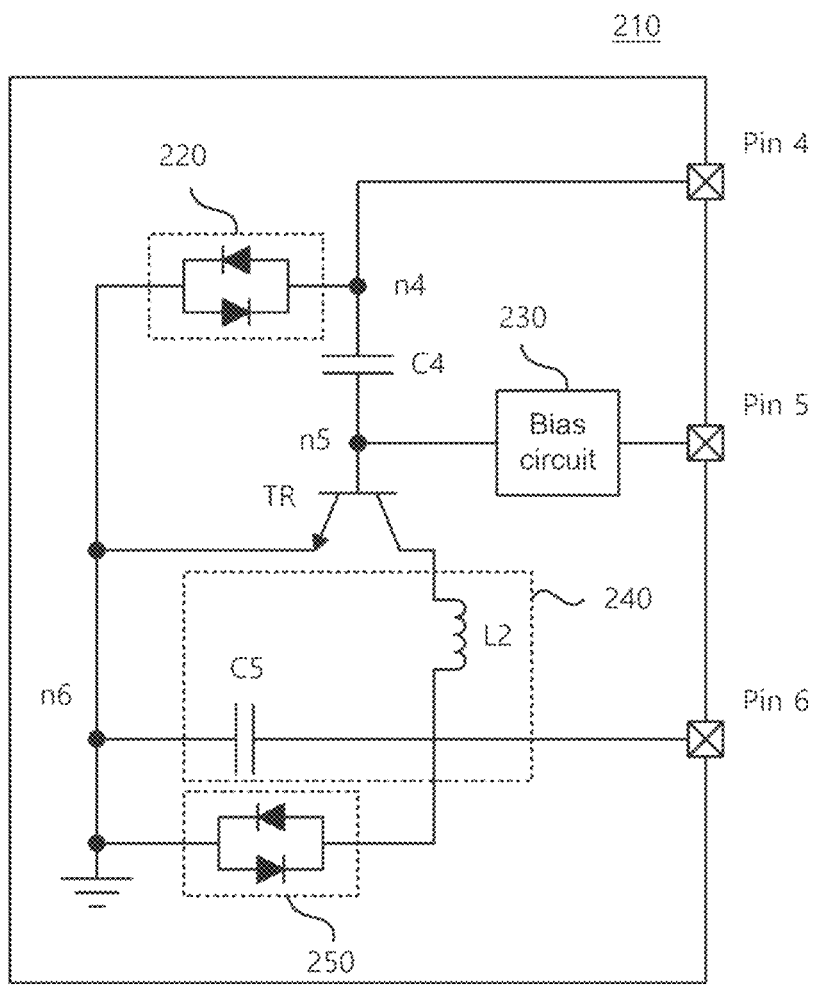
FIG. 7 is a diagram illustrating a power cell included in an RF chip of FIG. 6.

FIG. 7 is a diagram illustrating a power cell included in an RF chip 200 of FIG. 6. In FIG. 7, a compound semiconductor device TR included in the power cell 210 is illustrated as an HBT for convenience, but as described above, the compound semiconductor device TR may be understood to include (or to be selected from among) all of group III-V compound semiconductor devices.

Referring to FIG. 7, the power cell 210 includes the fourth to sixth pins Pin 4, Pin 5, and Pin 6 (e.g., a fourth pin Pin 4, a fifth pin Pin 5 and a sixth pin Pin 6), a first bidirectional diode 220, a bias circuit 230, the compound semiconductor device TR, an internal matching network 240, and/or a second bidirectional diode 250.

The fourth to sixth pins Pin 4, Pin 5, and Pin 6 are pins included in the second port P2. The fourth to sixth pins Pin 4, Pin 5, and Pin 6 are connected to the first to third pins Pin 1, Pin 2, and Pin 3 to input and output signals related to an operation of the power cell 210.

The first bidirectional diode 220 is connected to a fourth node n4, connected to the fourth pin Pin 4, and an emitter of the compound semiconductor device TR, and may prevent or reduce damage to the power cell 210 caused by electrostatic discharge (ESD) stress.

The bias circuit 230 is connected to the fifth pin Pin 5 and a fifth node n5 to apply a bias voltage to the compound semiconductor device TR. Since the fifth pin Pin 5 is connected to the BGR circuit 42 through the above-described second pin Pin 2, the bias circuit 230 may receive the reference signal $V_{CTRL}$ from the BGR circuit 42 to provide a bias voltage to the compound semiconductor device TR. A detailed description of the bias circuit 230 will be described later.

As described above, since the compound semiconductor device TR is illustrated as the HBT in FIG. 7 for convenience, the description will be based on the HBT. A base of the compound semiconductor device TR is connected to the fifth node n5, and the transmission RF signal RF_Tx is input through a capacitor C4 for coupling connected between the fourth node n4 and the fifth node n5. A collector and the emitter of the compound semiconductor device TR are connected to the internal matching network 240. Since the internal matching network 240 is connected to the sixth pin Pin 6, the compound semiconductor device TR amplifies the transmission RF signal RF_Tx and outputs it to the sixth pin Pin 6.

The internal matching network 240 is connected to the collector and the emitter of the compound semiconductor device TR, and the sixth pin Pin 6. The internal matching network 240 may provide impedance matching as a load matching network from the viewpoint of the compound semiconductor device TR.

According to embodiments, the internal matching network 240 may include an inductor L2 and/or a capacitor C5, the inductor L2 having one end connected to the collector of the compound semiconductor device TR and the other end connected to the second bidirectional diode 250, and the capacitor C5 having one end connected to a sixth node n6, connected to the emitter of the compound semiconductor device TR, and the other end connected to the sixth pin Pin 6, as illustrated. The inductor L2 and the capacitor C5 of the internal matching network 240 and the inductor L1 of FIG. 3 described above may provide impedance matching as an L-selective matching network. In this case, when the inductor L1 has a low Q value, the capacitor C5 may be implemented to have a high Q value so as to compensate for the losses incurred as a result. Since the above-described configuration of the internal matching network 240 is merely an example, embodiments are not limited thereto and may be configured in various forms capable of providing impedance matching to the compound semiconductor device TR.

The second bidirectional diode 250 is connected between the internal matching network 240 and the sixth node n6 connected to the emitter of the compound semiconductor device TR. Like the first bidirectional diode 220, the second bidirectional diode 250 may prevent or reduce damage to the power cell 210 due to the ESD stress.

Figure 8:
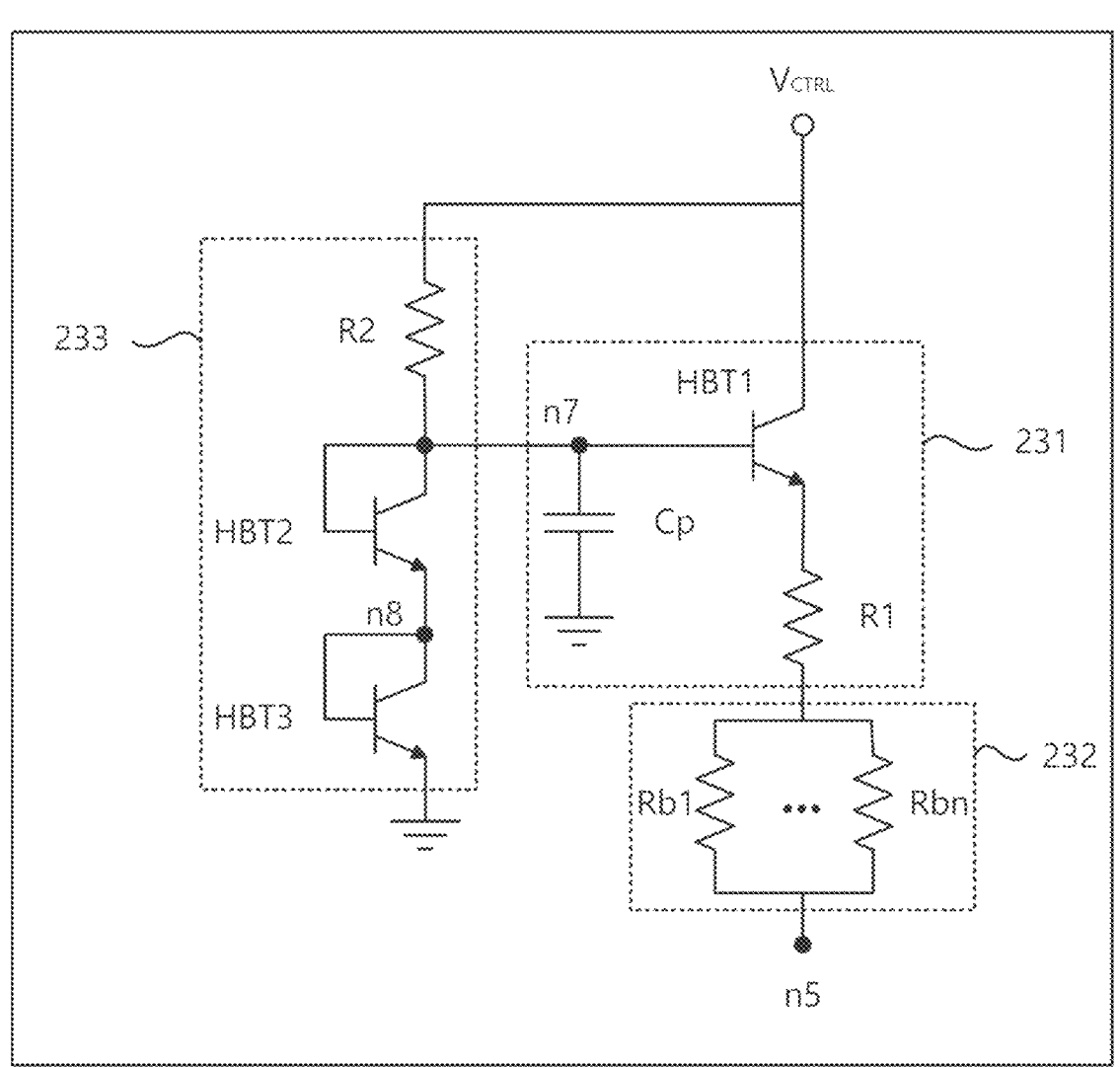
FIG. 8 is a diagram illustrating a bias circuit of FIG. 7.

FIG. 8 is a diagram illustrating a bias circuit of FIG. 7.

Referring to FIG. 8, the bias circuit 230, according to embodiments, includes a linearizer 231, a base ballast resistor array 232, and/or a temperature compensator 233.

The linearizer 231 includes a first HBT 'HBT1' having a collector connected to a $V_{CTRL}$ port provided for providing the reference signal $V_{CTRL}$, a base connected to a seventh node n7, and an emitter connected to a first resistor R1, and a capacitor Cp connected to the seventh node n7.

The base ballast resistor array 232 is connected to the first resistor and the fifth node n5 and includes a plurality of ballast resistors Rb1 to Rbn. The reference signal $V_{CTRL}$ may be applied to the fifth node n5 through the base ballast resistor array 232.

The temperature compensator 233 includes a second resistor connected to the $V_{CTRL}$ port and the seventh node n7, a second HBT 'HBT2' having a collector and a base connected to the seventh node n7 and an emitter connected to an eighth node n8, and a third HBT 'HBT3' having a collector and a base connected to the eighth node n8 and an emitter grounded.

The bias circuit 230 may operate as follows.

First, the first HBT 'HBT1' included in the linearizer 231 operates as a voltage source/current source. As the power increases, the RF input power leakage to the first HBT 'HBT1' increases. In this case, the base-terminated first HBT 'HBT1' may be regarded as operating as a PN diode, which is a rectifier. Accordingly, the DC current rectified by the first HBT 'HBT1' compensates for the voltage drop at the base and emitter. Since the DC current increases as the temperature increases, the second HBT 'HBT2', the third HBT 'HBT3', and the second resistor included in the temperature compensator 233 control the voltage of the seventh node n7 to decrease the base voltage of the compound semiconductor device TR at the higher temperature.

According to the bias circuit 230 described above, the linearity of the compound semiconductor device biased through the bias circuit 230 may be ensured (or improved). Conventional bias circuits are implemented with only a power supply voltage, a base bias resistor, and a ballast resistor, and as such, the base-emitter voltage $V_{BE}$ of the compound semiconductor device decreases due to the base current $I_B$ increased as the output increases, resulting in reduced linearity. In contrast, in the case of the bias circuit 230 according to embodiments of the present disclosure, even though the base current $I_B$ increases as the output increases, the base-emitter voltage $V_BE$ is recovered, and thus linearity may be ensured (or improved).

Figure 9:
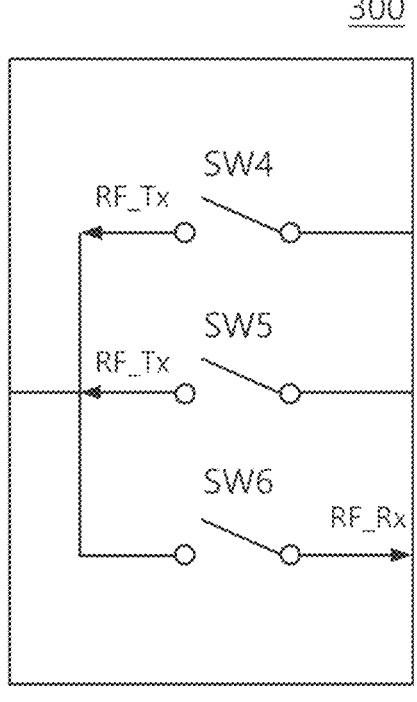
FIG. 9 is a diagram illustrating an FEM of FIG. 6.

FIG. 9 is a diagram illustrating an FEM of FIG. 6.

Referring to FIG. 9, the FEM 300 includes a plurality of switches SW4, SW5, and SW6 included in each of a first transmission path, a second transmission path, and a reception path. The plurality of switches SW4, SW5, and SW6 guide the transmission RF signal RF_Tx to the first transmission path or the second transmission path through the switching operation, or guide the reception RF signal RF_Rx to the reception path through the switching operation. For example, the plurality of switches SW4, SW5, and SW6 may be implemented as SP3T type switches as illustrated.

The FEM 300, according to embodiments, includes only the plurality of switches SW4, SW5, and SW6, and does not include a separate amplifier. Accordingly, since the FEM 300 of the electronic device 1000 of FIG. 6 performs only a signal transmission operation with the antenna ANT without an RF signal amplification operation, and the amplification operation is performed through the above-described power cell 210 while being able to be implemented at a lower cost, so the FEM 300 of the electronic device 1000 may have higher performance compared to that of the conventional volume terminals.

Figure 10:
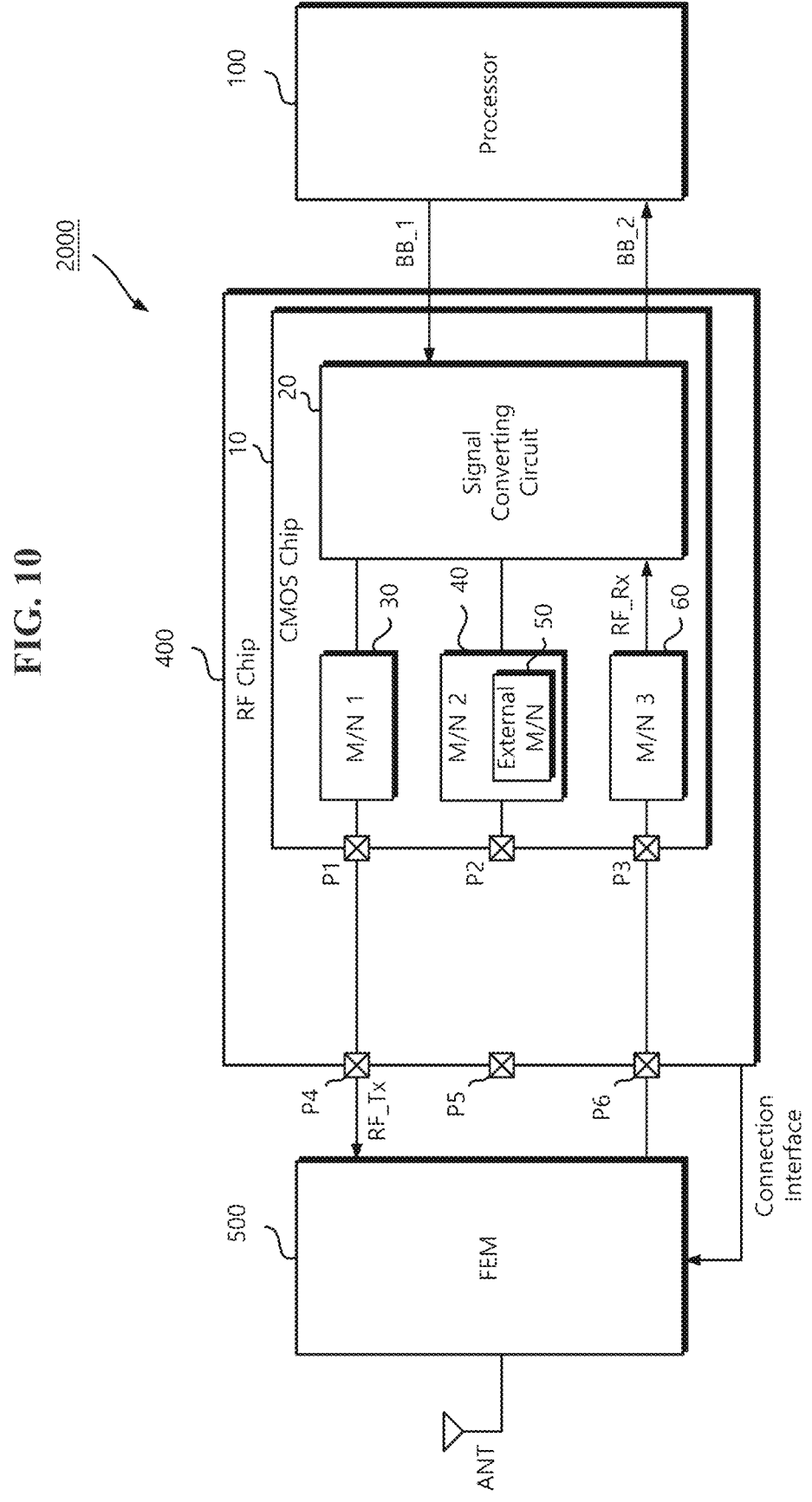
FIG. 10 is a diagram illustrating an electronic device, according to embodiments of the present disclosure.

FIG. 10 is a diagram illustrating an electronic device, according to embodiments of the present disclosure.

Referring to FIG. 10, an electronic device 2000 includes the processor 100, a radio frequency (RF) chip 400, an FEM 500, and/or the antenna ANT. The electronic device 2000 of FIG. 10 may correspond to the above-described flagship terminal. Hereinafter, a detailed description of the overlapping portion with FIG. 6 may be omitted to avoid redundancy.

The processor 100 provides the first baseband signal BB_1 to the RF chip 400, and/or receives and processes the second baseband signal BB_2 from the RF chip 400.

The RF chip 400 generates the transmission RF signal RF_Tx based on the first baseband signal BB_1 generated by the processor 100 and/or processes the reception RF signal RF_Rx to obtain the second baseband signal BB_2.

In the electronic device 2000 of FIG. 10 according to embodiments, the second transmission path is deactivated unlike in FIG. 6. In detail, a power cell is not included between the second port P2 and the fifth port P5, and the second port P2 and the fifth port P5 are disconnected from each other. Accordingly, the signal converting circuit 20 deactivates the second matching network 40. For example, in the signal converting circuit 20, the switching unit 26 illustrated in FIG. 3 may deactivate the second matching network 40 by turning off the second switch SW2. Accordingly, the RF chip 400 of FIG. 10 does not guide the transmission RF signal RF_Tx to the second transmission path.

According to embodiments, since the second matching network 40 is deactivated, the FEM 500 is driven through the DA included in a signal converting unit (e.g., the signal converting circuit 20) of the RF chip 400. Since the DA may be designed for high-efficiency back-off performance as described above, it may be possible to drive the FEM 500 without loss (or with reduced loss) of power.

According to embodiments, since the second matching network 40 is deactivated, the fourth port P4 and the sixth port P6 included in the RF chip 400 are connected to respectively the first port P1 and the third port P3 included in the CMOS chip 10, but the fifth port P5 and the second port P2 are disconnected from each other. Accordingly, the fourth port P4 and the sixth port P6 may be connected to the CMOS chip 10 through the RDL, but the fifth port P5 is disconnected to the CMOS chip 10.

The RF chip 400 may be connected to the FEM 500 through a connection interface to control the FEM 500. Although the second transmission path is deactivated, the RF chip 400 may still operate in the first mode with lower performance and the second mode with higher performance. In detail, the RF chip 400 deactivates the second matching network 40 and activates only the first matching network 30 in both the first mode and the second mode to transfer the transmission RF signal RF_Tx to the FEM 500. Thereafter, the RF chip 400 allows the FEM 500 to amplify the transmission RF signal RF_Tx with a relatively low output in the first mode, and allows the FEM 500 to amplify the transmission RF signal RF_Tx with a relatively high output in the second mode. A detailed description of control of the FEM 500 will be described later.

The FEM 500 is connected to the RF chip 400, amplifies the transmission RF signal RF_Tx and/or the reception RF signal RF_Rx, and guides the amplified RF signal to one of the first transmission path and/or the reception path.

According to embodiments, the FEM 500 may be connected to the fourth port P4 and the sixth port P6 through the PCB or the FPCB. Since the second port P2 and the fifth port P5 are deactivated as described above, the connection between the FEM 500 and the RF chip 400 through the fifth port P5 is disconnected. In addition, according to embodiments, the FEM 500 may be connected to the RF chip 400 through a connection interface such as the MIPI and may operate under a control of the RF chip 400.

The antenna ANT transmits the transmission RF signal RF_Tx, and/or receives the reception RF signal RF_Rx. According to embodiments, the electronic device 2000 may transmit the transmission signal RF_TX via the antenna ANT according to the first mode or the second mode.

Figure 11:
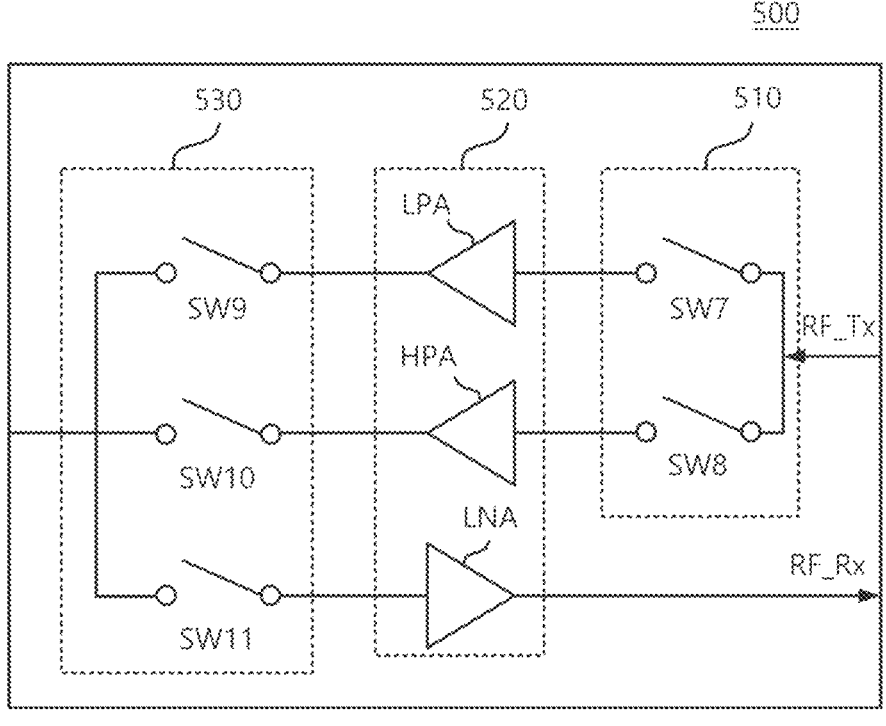
FIG. 11 is a diagram illustrating an FEM included in an electronic device of FIG. 10.

FIG. 11 is a diagram illustrating an FEM included in an electronic device of FIG. 10.

Referring to FIG. 11, the FEM 500 includes an input switching unit 510, an FEM amplifying unit 520, and/or an output switching unit 530, and guides the transmission RF signal RF_Tx to one of a first branch path and/or a second branch included in the first transmission path.

The input switching unit 510 is connected to the RF chip 400 and includes a seventh switch SW7 and an eighth switch SW8. The input switching unit 510 receives the transmission RF signal RF_Tx from the RF chip 400 through the first transmit path, and the seventh switch SW7 or the eighth switch SW8 applies the transmission RF signal RF_Tx received from the RF chip 400 to an amplifying unit through one of the first branch path and/or the second branch path, based on a switching operation in which one of the switches SW7 and SW8 is turned on.

The FEM amplifying unit 520 includes a low power amplifier (LPA), a high power amplifier (HPA), and an LNA. The LPA and HPA respectively amplify the transmission RF signal RF_Tx and transmit it to the output switching unit 530, and the LNA amplifies the reception RF signal RF_Rx in low noise and transmits the amplified reception RF signal RF_Rx to the RF chip 400. The LPA and HPA may operate in the first mode and the second mode, respectively. In detail, in the first mode, which is a low performance mode, the LPA configured to amplify the transmission RF signal RF_Tx with a relatively low power operates, and in the second mode, which is a high performance mode, the HPA configured to amplify the transmission RF signal RF_Tx with a relatively high power operates.

The output switching unit 530 guides the transmission RF signal RF_Tx and the reception RF signal RF_Rx based on the switching operation. The output switching unit 530 includes a ninth switch SW9 and a tenth switch SW10 that guide the transmission RF signal RF_Tx to the antenna ANT through the first branch path and the second branch path, and an eleventh switch SW11 that guides the reception RF signal RF_Rx to the FEM amplifying unit 520 through the reception path.

As described above, the FEM 500, according to embodiments, amplifies and guides the transmission RF signal RF_Tx and/or the reception RF signal RF_Rx through the first branch path including the seventh switch SW7, the LPA, and the ninth switch SW9, the second branch path including the eighth switch SW8, the HPA, and the tenth switch SW10, and the reception path including the LNA and the eleventh switch SW11. Since the FEM 500 guides the transmission RF signal RF_Tx to the first branch path when operating in the first mode, the FEM 500 amplifies the transmission RF signal RF_Tx with a relatively low power through the LPA. Since the FEM 500 guides the transmission RF signal RF_Tx to the second branch path when operating in the second mode, the FEM 500 amplifies the transmission RF signal RF_Tx with a relatively high power through the HPA.

According to the electronic device 2000 described above, unlike the electronic device 1000 of FIG. 6, since the power cell 210 including the compound semiconductor device is removed and the transmission RF signal RF_Tx is amplified through the LPA and the HPA included in the FEM 500, a higher-performance transmission/reception operation is possible. Since the second matching network 40 included in the CMOS chip 10 is deactivated when the compound semiconductor device is not included in the second transmission path, the compound semiconductor device may be removed without affecting the performance of the electronic device 2000. Therefore, even though the same CMOS chip 10 as (or a similar CMOS chip 10 to) that of the electronic device 1000 of FIG. 6 is mounted, it may operate as the flagship terminal.

According to embodiments of the present disclosure, it may be possible to support a hybrid type transceiver in which a compound device-based power cell and a CMOS process-based passive design are combined.

Conventional devices for wireless communications may be implemented as volume terminals or flagship terminals. Volume terminals lack the higher-cost, and higher-performance, FEMs of flagship terminals, and thus, provide insufficient communication performance. Also, the conventional devices are developed separately (e.g., differently) depending on whether a respective conventional device is to be implemented as a volume terminal or a flagship terminal, resulting in excessive costs (e.g., due to duplication of effort and resource consumption in developing and/or manufacturing different devices in parallel).

However, according to embodiments, an improved CMOS chip is provided, together with improved electronic devices incorporating the CMOS chip. The CMOS chip may be used in such an improved electronic device to be implemented as either a volume terminal or a flagship terminal, thereby reducing development and/or manufacturing costs with respect to those of the conventional devices which are developed and/or manufactured separately. Also, the implementation of a CMOS process to manufacture (e.g., fabricate) the CMOS chip is a lower-cost process, further reducing the manufacturing costs with respect to those of the conventional devices.

Additionally, according to embodiments, when used in an improved electronic device implemented as a volume device (e.g., without the higher cost FEM), the CMOS chip may provide improved communication performance, with respect to that of the conventional devices. For example, the CMOS chip may include a matching network configured to match an impedance of compound semiconductor device included in an RF chip of the improved electronic device. In contrast to the conventional devices that lack such a compound semiconductor device, the improved electronic device including the CMOS chip and the compound semiconductor device may provide improved communication performance without the higher cost FEM of electronic devices implemented as flagship terminals. Therefore, the improved CMOS chip and improved electronic device overcomes the deficiencies of the conventional devices to at least reduce costs and/or improve communication performance.

According to embodiments, operations described herein as being performed by the CMOS chip 10, the first matching network 30, the third matching network 60, the signal converting circuit 20, the filter unit 21, the PLL 24, the first mixer unit MIX1, the second mixer unit MIX2, the amplifying unit 25, the switching unit 26, the first filter 22, the second filter 23, the DA, the LNA of the signal converting circuit 20, the BGR circuit 42, the electronic device 1000, the processor 100, the RF chip 200, the FEM 300, the first bidirectional diode 220, the second bidirectional diode 250, the electronic device 2000, the RF chip 400, the FEM 500, the FEM amplifying unit 520, the LPA, the HPA, and/or LNA of the FEM amplifying unit 520 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

According to embodiments, switching (e.g., switching operations, such as selectively opening/closing of respective switches) discussed herein may be performed by processing circuitry. According to embodiments, the switching discussed in connection with, for example, the switching unit 26, the plurality of switches SW4, SW5 and SW6 included in the FEM 300, the input switching unit 510 and the output switching unit 530 may each be controlled by processing circuitry. According to embodiments, the switching may be controlled by the processor 100. According to embodiments, the processing circuitry used to control the switching may be included in, for example, the signal converting circuit 20, the RF chip 200, the FEM 300, the RF chip 400, the FEM 500, and/or elsewhere within the CMOS chip 10, the electronic device 1000 and/or the electronic device 2000. According to embodiments, the processing circuitry used to control the switching discussed in connection with the plurality of switches SW4, SW5 and SW6 included in the FEM 300 may be controlled by processing circuitry included in the RF chip 200 via a control signal transmitted via the connection interface. According to embodiments, the processing circuitry used to control the switching discussed in connection with the input switching unit 510 and the output switching unit 530 may each be controlled by processing circuitry included in the RF chip 400 via a control signal transmitted via the connection interface. According to embodiments, the switching to select the first mode or the second mode may be performed by a manufacturer (e.g., automatically or by a technician) based on whether the electronic device (e.g., the electronic device 1000 or the electronic device 2000) is manufactured to include the power cell 210. According to embodiments, the processing circuitry is configured to control the switching to select the first mode or the second mode based on whether a connection to the power cell 210 is detected (e.g., at the second port P2).

The various operations of methods described above may be performed by any suitable device capable of performing the operations, such as the processing circuitry discussed above. For example, as discussed above, the operations of methods described above may be performed by various hardware and/or software implemented in some form of hardware (e.g., processor, ASIC, etc.).

The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or operations of a method or algorithm and functions described in connection with embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

It will be understood that when an element is referred to as being "connected" or "coupled" to another element, it may be directly connected or coupled to the other element or intervening elements may be present. As used herein the term "and/or" includes any and all combinations of one or more of the associated listed items.

The above are specific examples for carrying out the present disclosure. Embodiments in which a design is changed simply, or which are easily changed, may be included in the present disclosure as well as the examples described above. In addition, embodiments may include technologies that are easily changed and implemented by using the above examples. While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A CMOS chip comprising:
a signal converting circuit configured to convert a baseband signal and an RF signal;
a plurality of ports through which the RF signal is transmitted or received, the plurality of ports being respectively included in a first transmission path, a second transmission path, and a reception path; and
a plurality of matching networks connected to the signal converting circuit, the plurality of matching networks being respectively connected to the plurality of ports, a first matching network among the plurality of matching networks including an external matching network, and the external matching network being configured to perform an impedance matching of a compound semiconductor device that is included in a power cell, wherein the compound semiconductor device is external relative to the CMOS chip.

2. The CMOS chip of claim 1, wherein the signal converting circuit is configured to activate or deactivate the first matching network based on whether the compound semiconductor device is included in the second transmission path.

3. The CMOS chip of claim 1, wherein the signal converting circuit and the plurality of matching networks are implemented based on a CMOS process.

4. The CMOS chip of claim 1, wherein the signal converting circuit comprises:
   a filter unit configured to filter the baseband signal;
   a PLL configured to generate an LO signal;
   a mixer unit configured to,
      up-convert the baseband signal based on the LO signal to generate the RF signal, or
      down-convert the RF signal to generate the baseband signal;
   an amplifying unit configured to amplify the RF signal; and
   a switching unit configured to guide the RF signal to one of the first transmission path or the second transmission path based on a switching operation.

5. The CMOS chip of claim 4, wherein the switching unit is configured to:
   activate the first matching network when the compound semiconductor device is included in the second transmission path; and
   deactivate the first matching network when the compound semiconductor device is not included in the second transmission path.

6. The CMOS chip of claim 4, wherein the first matching network further comprises:
   a source matching network connected to the amplifying unit and a first port among the plurality of ports; and
   a BGR circuit configured to apply a reference signal, the BGR circuit being connected to a second port among the plurality of ports.

7. The CMOS chip of claim 1, wherein the external matching network is connected to a first port among the plurality of ports and an antenna port.

8. An electronic device comprising:
   processing circuitry configured to generate a first baseband signal;
   an RF chip configured to,
      generate a transmission RF signal based on the first baseband signal, or
      to process a reception RF signal to obtain a second baseband signal;
   a FEM configured to,
      guide the transmission RF signal to one of a first transmission path or a second transmission path, and
      guide the reception RF signal to a reception path; and
   an antenna configured to transmit the transmission RF signal or to receive the reception RF signal,
   wherein
      the RF chip includes:
         a CMOS chip including,
            a signal converting circuit configured to generate the transmission RF signal or process the reception RF signal,
            a first plurality of ports respectively included in the first transmission path, the second transmission path, and the reception path, and
            a plurality of matching networks connected to the signal converting circuit, the plurality of matching networks being respectively connected to the first plurality of ports,
         a second plurality of ports connected to the FEM, the second plurality of ports being respectively included in the first transmission path, the second transmission path, and the reception path, and
            a power cell between a first port and a second port, the first plurality of ports including the first port, the second plurality of ports including the second port, and the power cell including a compound semiconductor device, and
         a first matching network among the plurality of matching networks includes an external matching network, the external matching network being configured to perform an impedance matching of the compound semiconductor device that is external relative to the CMOS chip.

9. The electronic device of claim 8, wherein the compound semiconductor device is a group III-V compound semiconductor device.

10. The electronic device of claim 8, wherein the first matching network further comprises:
   a first pin, a second pin and a third pin each included in the first port;
   a source matching network connected to the first pin; and
   a BGR circuit connected to the second pin, the BGR circuit being configured to apply a reference signal.

11. The electronic device of claim 10, wherein the power cell further comprises:
   a fourth pin, a fifth pin and a sixth pin each included in the first port;
   a first bidirectional diode connected to the fourth pin and an emitter of the compound semiconductor device;
   a bias circuit connected to the fifth pin, the bias circuit being configured to apply a bias voltage to the compound semiconductor device based on the reference signal;
   an internal matching network connected to a collector of the compound semiconductor device, the emitter of the compound semiconductor device and the sixth pin, the internal matching network being a matching network inside the power cell and configured to perform an impedance matching as a load matching network relative to the compound semiconductor device; and
   a second bidirectional diode connected to the internal matching network and the emitter of the compound semiconductor device.

12. The electronic device of claim 11, wherein the external matching network is connected to the third pin and the second port.

13. The electronic device of claim 10, wherein the source matching network and the external matching network are implemented based on a CMOS process.

14. The electronic device of claim 8, wherein the electronic device is configured to transmit the transmission RF signal at a higher power via the second transmission path than via the first transmission path.

15. The electronic device of claim 8, wherein the electronic device is configured to:
   activate the first transmission path in a first mode to transmit the transmission RF signal; and
   activate the second transmission path in a second mode set to transmit the transmission RF signal at a higher power than in the first mode.

16. An electronic device comprising:
   processing circuitry configured to generate a first baseband signal;
   an RF chip configured to,
      generate a transmission RF signal based on the first baseband signal, or

US 12,580,597 B2

19 to process a reception RF signal to obtain a second baseband signal;

a FEM configured to, amplify the transmission RF signal to obtain an amplified transmission RF signal, and guide the amplified transmission RF signal to a first transmission path, and amplify the reception RF signal to obtain an amplified reception RF signal, and guide the amplified transmission RF signal to a reception path; and an antenna configured to transmit the transmission RF signal or to receive the reception RF signal, wherein the RF chip includes:

a CMOS chip including, a signal converting circuit configured to generate the transmission RF signal or process the reception RF signal, a first plurality of ports respectively included in the first transmission path, a second transmission path, and the reception path, and a plurality of matching networks connected to the signal converting circuit, the plurality of matching networks being respectively connected to the first plurality of ports, and a second plurality of ports respectively included in the first transmission path, the second transmission path, and the reception path, and a first matching network among the plurality of matching networks includes an external matching network, the external matching network being configured to perform an impedance matching of a compound semiconductor device that is included in a power cell, wherein the compound semiconductor device is external relative to the CMOS chip, and the second transmission path is deactivated.

17. The electronic device of claim 16, wherein the signal converting circuit comprises:

a filter unit configured to filter the first baseband signal and the second baseband signal;

a PLL configured to generate an LO signal;

a mixer unit configured to, up-convert the first baseband signal based on the LO signal to generate the transmission RF signal, or down-convert the reception RF signal to generate the second baseband signal;

an amplifying unit configured to amplify the transmission RF signal and the reception RF signal; and a switching unit configured to transmit the transmission RF signal to the first transmission path.

18. The electronic device of claim 17, wherein the switching unit is configured to deactivate the first matching network.

19. The electronic device of claim 16, wherein the FEM comprises:

an input switching unit configured to guide the transmission RF signal to one of a first branch path or a second branch path based on a switching operation, both of the first branch path and the second branch path branching from the first transmission path;

an FEM amplifying unit connected to each of the first branch path, the second branch path, and the reception path, the FEM amplifying unit being configured to amplify the transmission RF signal and the reception RF signal; and an output switching unit configured to, guide the transmission RF signal to the antenna through the first branch path or the second branch path based on a switching operation, or guide the reception RF signal to the FEM amplifying unit through the reception path.

20. The electronic device of claim 19, wherein the electronic device is configured to transmit the transmission RF signal via the second branch path at a higher power than via the first branch path.

* * * * *